(12) United States Patent
De Geest (10) Patent No.: US 8,361,896 B2
(45) Date of Patent: Jan. 29, 2013

(54) SIGNAL TRANSMISSION FOR HIGH SPEED INTERCONNECTIONS

(75) Inventor: Jan De Geest, Wetteren (BE)

(73) Assignee: FCI, Guyancourt (FR)

( * ) Notice: Subject to any disclaimer, the term of this patent is extended or adjusted under 35 U.S.C. 154(b) by 0 days.

(21) Appl. No.: 13/166,155

(22) Filed: Jun. 22, 2011

(65) Prior Publication Data
US 2011/0318962 A1 Dec. 29, 2011

Related U.S. Application Data

(60) Provisional application No. 61/358,836, filed on Jun. 25, 2010.

(51) Int. Cl.
*H01R 13/648* (2006.01)
(52) U.S. Cl. ...................................................... 438/607
(58) Field of Classification Search ............ 439/107.07, 439/107.05, 107.08, 107.1–107.15, 79, 608, 439/101, 607.07, 607.05, 607.08, 607.1–607.15; 361/794, 760; 174/255, 260
See application file for complete search history.

(56) References Cited

U.S. PATENT DOCUMENTS

| | | | | |
|---|---|---|---|---|
| 5,066,236 A | * | 11/1991 | Broeksteeg | ..................... 439/79 |
| 5,101,177 A | | 3/1992 | Norimatsu | |
| 6,540,558 B1 | | 4/2003 | Paagman | |
| 6,710,266 B2 | | 3/2004 | Mix et al. | |
| 7,544,897 B2 | * | 6/2009 | Kobayashi | ..................... 174/254 |
| 7,645,944 B2 | | 1/2010 | Casher et al. | |
| 7,883,367 B1 | * | 2/2011 | Kline | ..................... 439/607.05 |
| 2001/0010978 A1 | * | 8/2001 | Paagman | ..................... 439/79 |
| 2003/0220018 A1 | * | 11/2003 | Winings et al. | ..................... 439/608 |
| 2003/0220020 A1 | | 11/2003 | Billman | |
| 2006/0014433 A1 | | 1/2006 | Consoli et al. | |
| 2006/0134852 A1 | | 6/2006 | Jang | |
| 2007/0249186 A1 | * | 10/2007 | Ju | ..................... 439/71 |
| 2009/0260860 A1 | | 10/2009 | Pai et al. | |
| 2010/0176699 A1 | | 7/2010 | Biba et al. | |

* cited by examiner

*Primary Examiner* — Edwin A. Leon
*Assistant Examiner* — Harshad Patel
(74) *Attorney, Agent, or Firm* — Woodcock Washburn LLP (57) ABSTRACT

A connector assembly includes a substrate and a connector. The substrate includes a ground layer and a trace layer. The substrate defines a substrate edge, and the ground layer defines a ground edge. The connector is mounted on the substrate such that a portion of the connector overhangs the substrate edge of the substrate. The connector includes a first signal contact that defines a mating portion, a mounting portion, a first transition portion connected to the mating portion, and a second transition portion connected to the first transition portion and the mounting portion. The first transition portion of the signal contact at least partially crosses the ground edge such that a gap is defined between the ground edge and the first transition portion and a substantial portion of the second transition portion extends over the gap when the electrical connector is mounted on the substrate.

18 Claims, 9 Drawing Sheets

SIGNAL TRANSMISSION FOR HIGH SPEED INTERCONNECTIONS

CROSS-REFERENCE TO RELATED APPLICATIONS

The application claims the benefit of U.S. Provisional Patent Application Ser. No. 61/358,836, filed Jun. 25, 2010, the disclosure of which is hereby incorporated by reference as if set forth in its entirety herein.

BACKGROUND

An electrical system, such as a computer, for example, may include components mounted on printed circuit boards, such as daughter cards, backplane boards, motherboards, and the like, that are interconnected to transfer power and data signals throughout the system.

Typically, a printed circuit board is a combination of stacked ground, trace, and dielectric layers. The ground layers and the trace layers in such printed circuit boards extend to peripheral edges of the board. In some circumstances a right angle electrical connector may be configured to mount onto the printed circuit board such that a portion of the connector overhangs an edge of the printed circuit board. The right-angle electrical connector includes a connector housing that supports a plurality of electrical signal contacts and electrical ground contacts disposed between adjacent electrical signal contacts. As a result of the overhang, signal degrading crosstalk may occur in the ground layers (in particular the first ground layer) of the printed circuit board.

Figure 1A:
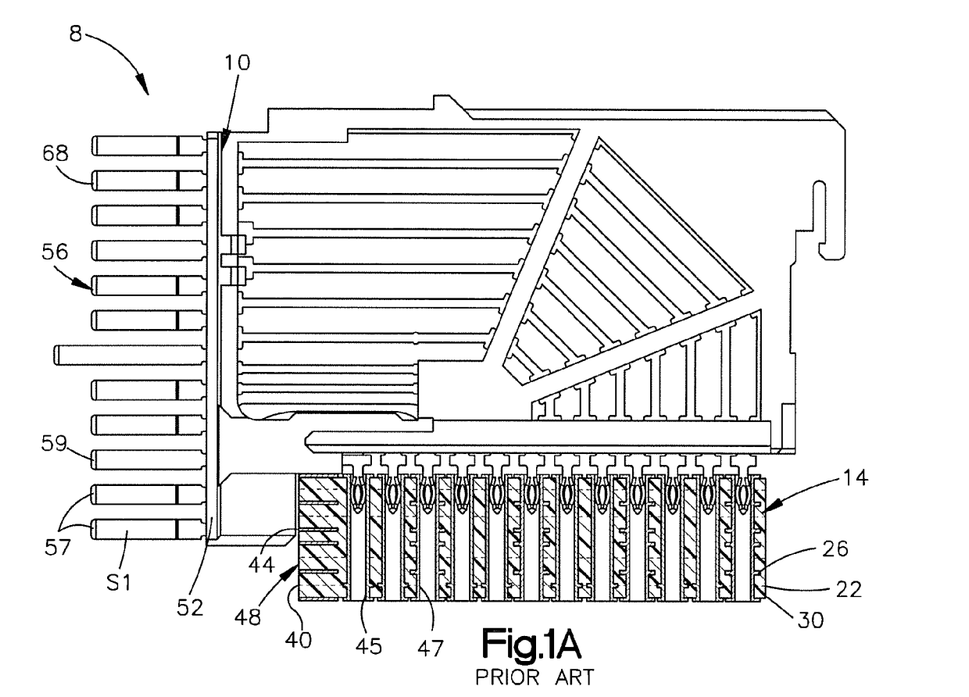
FIG. 1A is a side elevation view of a prior art electrical connector assembly including a right angle connector mounted on a printed circuit board.
Figure 1B:
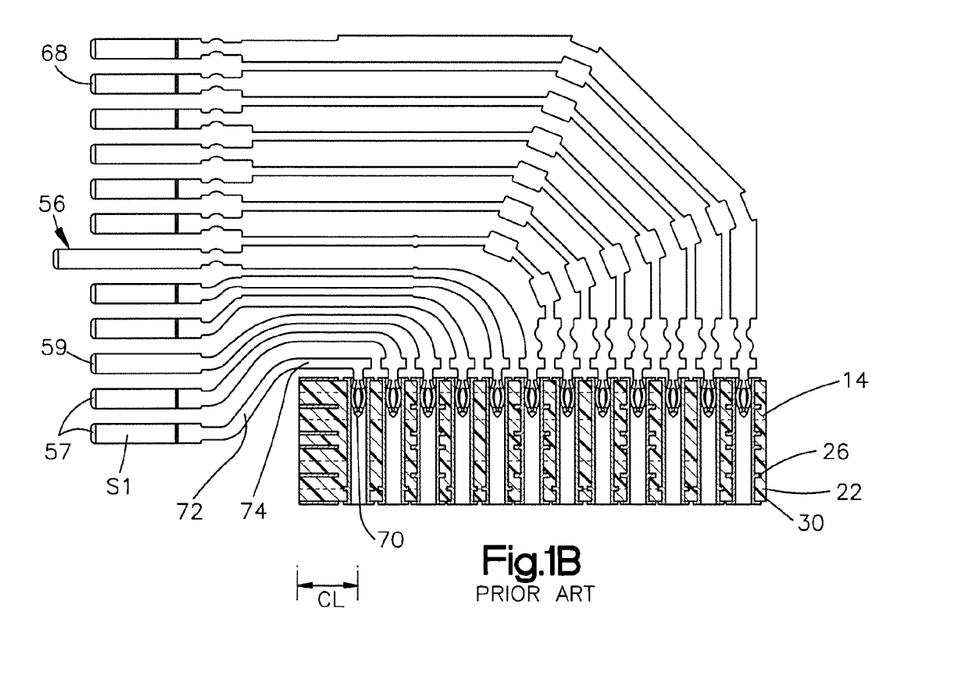
FIG. 1B is a side elevation view of the prior art electrical connector assembly shown in FIG. 1A, with the connector housing removed for clarity.

For example, as shown in FIGS. 1A and 1B, a conventional electrical connector assembly 8 includes a right-angle electrical connector 10 mounted onto a printed circuit board or substrate 14. The electrical connector 10 includes a dielectric connector housing that supports a plurality of electrical contacts 56, including signal contacts 57 and ground contacts 59. The electrical contacts 56, including the signal contacts 57, can each define a mating portion 68, a mounting portion 70, a first transition portion 72 connected to the mating portion 68, and a second transition portion 74 connected between the first transition portion 72 and the mounting portion 70. The signal contacts 57 are configured to transmit data signals between the substrate 14 and a complementary electrical component that is mated to the electrical connector 10.

As shown, the substrate 14 may include at least one, such as a plurality of trace layers 22, at least one, such as a plurality of ground layers 26, and at least one, such a plurality of dielectric layers 30 disposed between the trace layers 22 and the ground layers 26. The trace layer 22 is illustrated schematically as a continuous layer, though it should be appreciated that the trace layer 22 includes individual traces that are configured to selectively electrically connect to individual ones of the electrical signal contacts 57 of the electrical connector 10, adjacent ones of which can define differential signal pair such that the electrical ground contacts 59 are disposed between adjacent differential signal pairs.

For instance, the substrate 14 can define a first plurality of signal vias 45 that are electrically connected to the trace layers 22 and ground vias 47 that are electrically connected to the ground layers 26. Thus, when the mounting portion 70 of the signal contacts 57 are inserted into respective ones of the signal vias 45, the signal contacts 57 are electrically connected to respective traces of the substrate 14. Likewise, when the mounting portion 70 of the ground contacts 59 are inserted into respective ones of the ground vias 47, the ground contacts 59 are electrically connected to the ground layers 26 of the substrate 14. The ground vias 47 are electrically isolated from the trace layers 22, and the signal vias 45 are electrically isolated from the ground layers 26.

As shown, the trace layers 22 each include a trace layer edge 40 that is flush with a first ground layer edge 44 of each ground layer 26. The trace layer edges 40 and the ground layer edges can partially define a substrate edge 48. During operation of the electrical connector 10, at least a portion of the electromagnetic fields generated by the electrical signal contacts 57 are communicated to the upper ground layers 26, resulting in noise that is carried by the upper ground layers 26. As shown in FIGS. 1A and 1B, when the electrical connector 10 is mounted onto the substrate 14, a portion 52 of the connector 10 overhangs and abuts the substrate edge 48. Typically, the first transition portion 72 of at least the lowermost signal contact S1 crosses the first ground edge 44 of the ground layer 26, and the second transition portion 74 is positioned adjacent an upper surface of the ground layer 26 and overlaps the ground layer 26 by a common length CL when the electrical connector 10 is mounted on the substrate 14. Because the first transition portion 72 and the second transition portion 74 of the lowermost signal contact S1 is disposed proximate to the noise-carrying ground layers 26 of the substrate 14, crosstalk can be generated on at least the lowermost signal contact S1 that tends to degrade the signal carried by the lowermost signal contact S1.

SUMMARY

The applicant has discovered, through modeling, that signal degrading crosstalk in signal transmission systems may occur in ground layers of a substrate or board, particularly in the first ground layer of the substrate. A method to improve signal transmissions in an electrical connector assembly is disclosed. The method includes providing or teaching the use of a substrate having a ground layer and a trace layer separated by a dielectric material. The substrate may define a substrate edge, and the ground layer may define a first ground edge. A right angle connector may be provided, the connector may have a signal contact that defines a mating portion, a mounting portion, a first transition portion connected to the mating portion, and a second transition portion connected to the first transition portion and the mounting portion. The right angle connector may be configured to be attached to the printed circuit board such that the right angle connector overhangs the substrate edge of the printed circuit board, and the first transition portion of the signal contact at least partially crosses the first ground edge. The method may further include adjusting or teaching the adjustment of the right angle connector such that a gap is defined between the first ground edge and the first transition portion, and a substantial portion of the second transition portion extends over the gap when the electrical connector is mounted on the substrate.

Also disclosed is a connector assembly including a substrate, and a right angle connector mounted on the substrate. The substrate may include a ground layer and a trace layer separated by a dielectric material. The substrate may define a substrate edge, and the ground layer may define a first ground edge. The right angle connector may be mounted on the substrate such that a portion of the right angle connector overhangs the substrate edge of the substrate. The right angle connector may include a first signal contact that defines a mating portion, a mounting portion, a first transition portion connected to the mating portion, and a second transition portion connected to the first transition portion and the mounting portion. The first transition portion of the signal contact may at least partially cross the first ground edge such that a gap is defined between the first ground edge and the first transition portion, and a substantial portion of the second transition portion extends over the gap when the electrical connector is mounted on the substrate.

BRIEF DESCRIPTION OF THE DRAWINGS

The foregoing summary, as well as the following detailed description of an example embodiment of the application, will be better understood when read in conjunction with the appended drawings. For the purposes of illustrating the present disclosure, there is shown in the drawings an example embodiment. It should be understood, however, that the application is not limited to the precise arrangements and instrumentalities shown. In the drawings.

DETAILED DESCRIPTION

Figure 2:
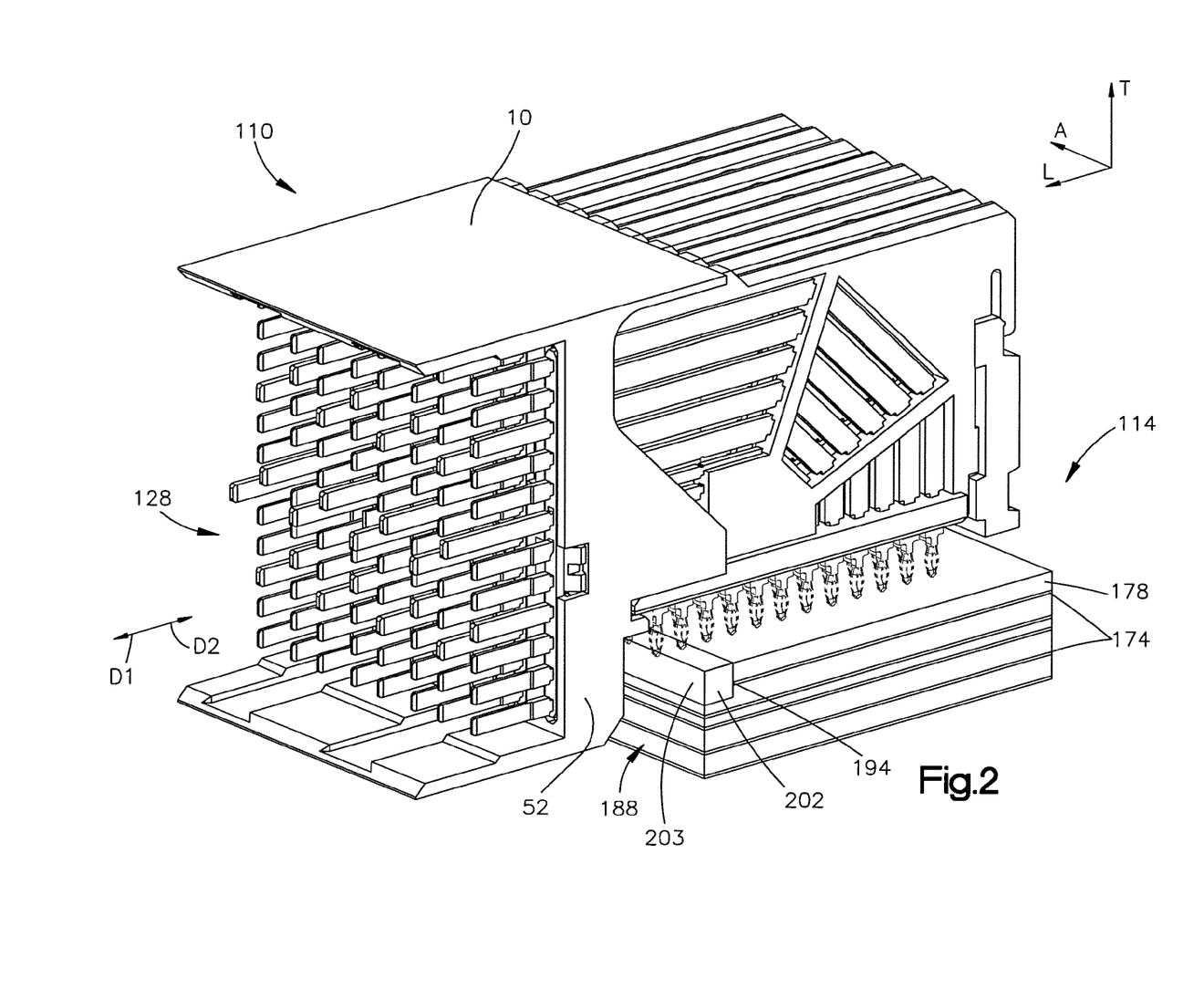
FIG. 2 is a front perspective view of an electrical connector assembly including a right angle connector mounted on a printed circuit board according to one embodiment, the printed circuit board having an upper ground layer that includes a dielectric portion.

In reference to FIG. 2, an electrical connector assembly 110 in accordance with one embodiment includes a substrate 114 that can be provided as a printed circuit board, and the electrical connector 10, for instance of the type described above with respect to FIGS. 1A-B, configured to be mounted onto the substrate 114 such that an overhang portion 52 of the electrical connector 10 overhangs a substrate edge 188 of the substrate 114. The substrate 114 is adjusted with respect to the substrate 14 illustrated in FIGS. 1A-B so as to decrease the electrical connector insertion loss, decrease the electrical connector insertion loss resonance at certain frequencies, and/or decrease the electrical connector crosstalk, without substantially affecting the impedance of the electrical connector assembly 110. The substrate 114 may be adjusted, for example, by retracting an edge of the ground layer of the substrate (FIG. 4), by enlarging the overhang of the electrical connector with respect to an edge of the substrate (FIG. 6), or both.

In accordance with the illustrated embodiment, the electrical connector assembly 110 extends along a transverse direction T that is oriented vertically as illustrated, and along longitudinal and lateral directions L and A that are oriented horizontally as illustrated, though it should be appreciated that the orientation of the electrical connector assembly 110 can vary during use. The electrical connector 10 is configured to be mounted to the substrate 114 along a transverse downward insertion direction. Moreover, the electrical connector 10 is configured to be mated with a complementary electrical component, such as a second electrical connector, along a longitudinally forward insertion direction D1, and unmated along an opposed longitudinally rearward direction D2.

For the purposes of clarity, the same or equivalent elements in the various embodiments illustrated in the drawings have been identified with the same reference numerals. Certain terminology is used in the following description for convenience only and is not limiting. The words "right" and "left", "upper" and "lower", and "front and rear" designate directions in the drawings to which reference is made. The words "inward," "inwardly," "outward," "outwardly," "upward," "upwardly," "downward," and "downwardly" refer to directions toward and away from, respectively, the geometric center of the device and designated parts thereof. The terminology intended to be non-limiting includes the above-listed words, derivatives thereof and words of similar import.

Figure 3A:
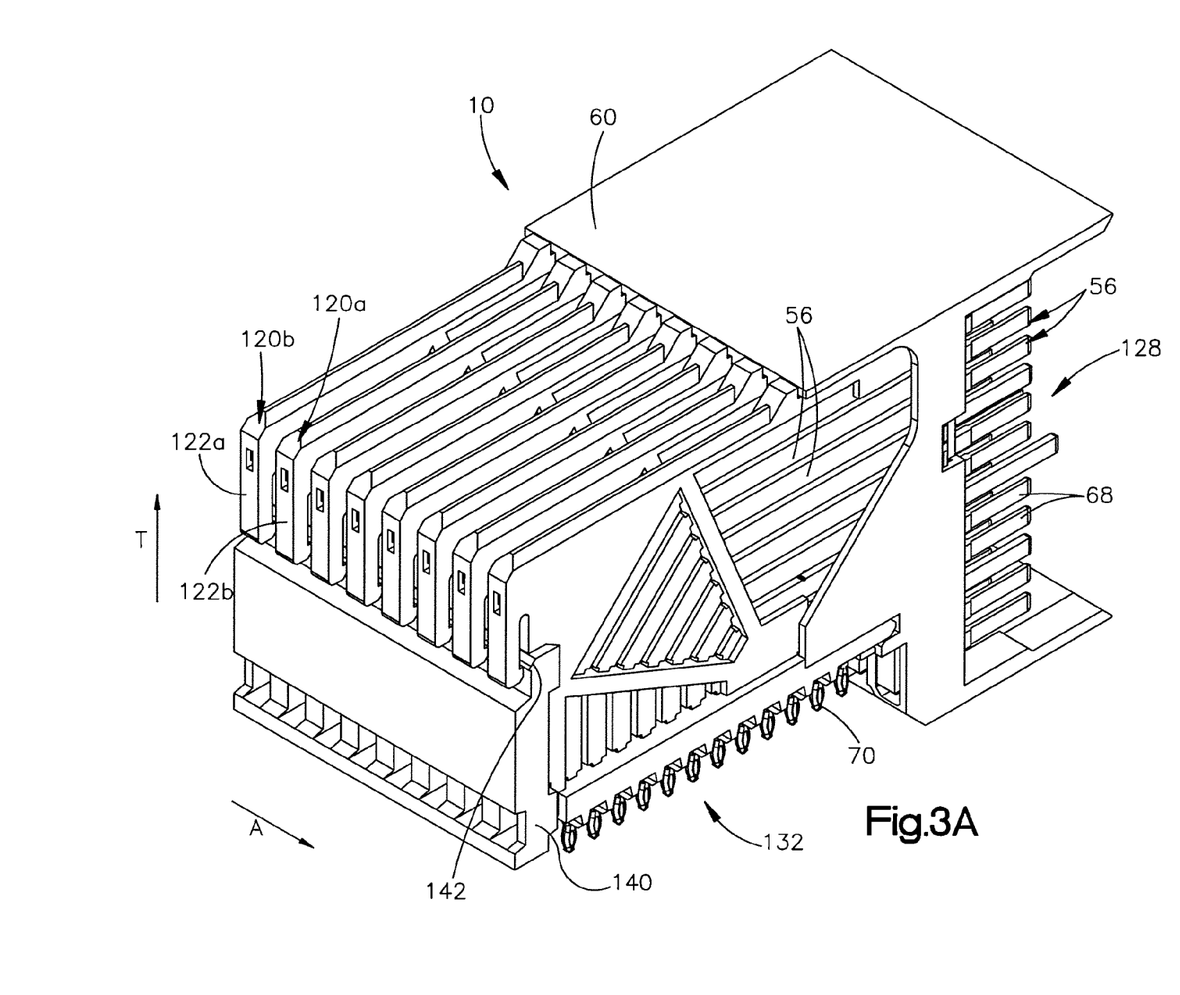
FIG. 3A is a back perspective view of the electrical connector shown in FIG. 2, the electrical connector including a connector housing, and a plurality of A-type and B-type leadframe assemblies carried by the connector housing.

In reference to FIG. 3A, the electrical connector 10 may be a right angle header connector, though it should be understood that the electrical connector 10 may be any electrical connector as desired. As shown in FIG. 3A, the electrical connector 10 includes a dielectric or electrically insulative connector housing 60 and a plurality of electrical contacts 56 that are carried by the connector housing 60. In accordance with the illustrated embodiment, the electrical connector 10 includes a plurality of A-type leadframe assemblies 120a and a plurality of B-type leadframe assemblies 120b, each including a leadframe housing 122a and 122b respectively, that carries the plurality of the electrical contacts 56. Each leadframe housing 122a and 122b can be made from a dielectric or electrically insulative material. In accordance with one embodiment, the leadframe assemblies 120a and 120b can be configured as insert molded leadframe assemblies (IMLAs), whereby the leadframe housings 122a and 122b are overmolded onto the electrical contacts 56. Alternatively, the electrical contacts 56 can be stitched or otherwise fixed in the leadframe housings 122a and 122b.

With continued reference to FIG. 3A, the leadframe assemblies 120a and 120b can be spaced apart from each other along a lateral row direction A, and the electrical contacts 56 of each leadframe assembly 120a and 120b can be spaced apart along a transverse column direction T, such that the electrical contacts 56 of adjacent leadframe assemblies 120a and 120b are arranged in an array of spaced apart, substantially parallel transverse columns. The electrical connector 10 may include an organizer 140 that retains the leadframe assemblies 120a and 120b in their desired orientation in the connector housing 60, for instance via a ridge 142 defined in the organizer 140. The organizer 140 can be electrically insulative or electrically conductive as desired.

The electrical connector 10 defines a mating face or interface 128 disposed proximate to the longitudinal front end of the connector housing 60 that is configured to mate with a mating interface of a second electrical connector, and a mounting interface 132 disposed proximate to the transverse bottom of the leadframe housings 122a and 122b that is configured to be mounted onto the underlying substrate 114.

Figure 3B:
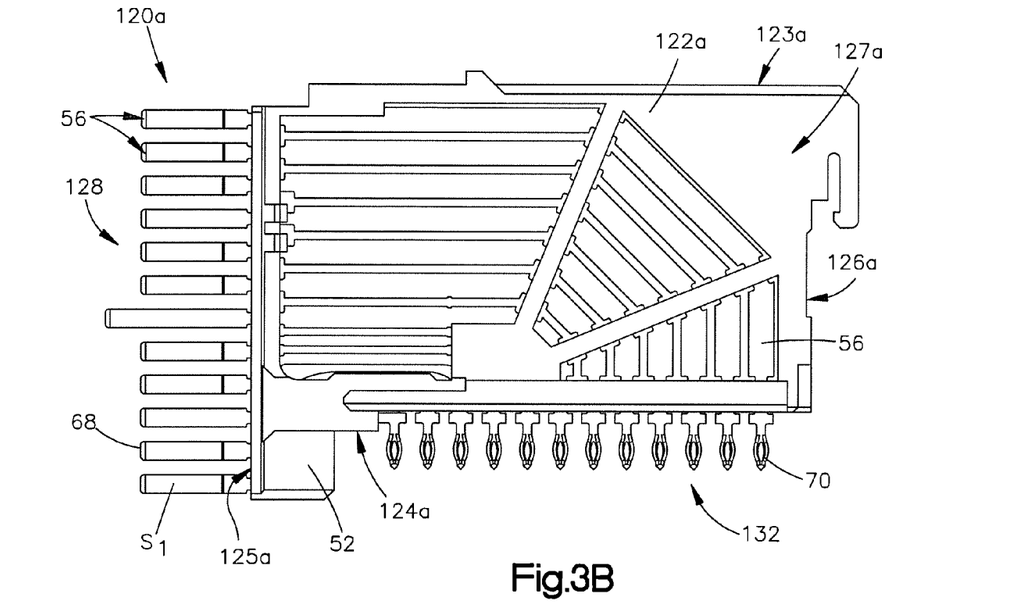
FIG. 3B is a side elevation view of one of the A-type leadframe assemblies shown in FIG. 3A, the A-type leadframe assembly including a leadframe housing, and a plurality of electrical contacts carried by the leadframe housing.
Figure 3C:
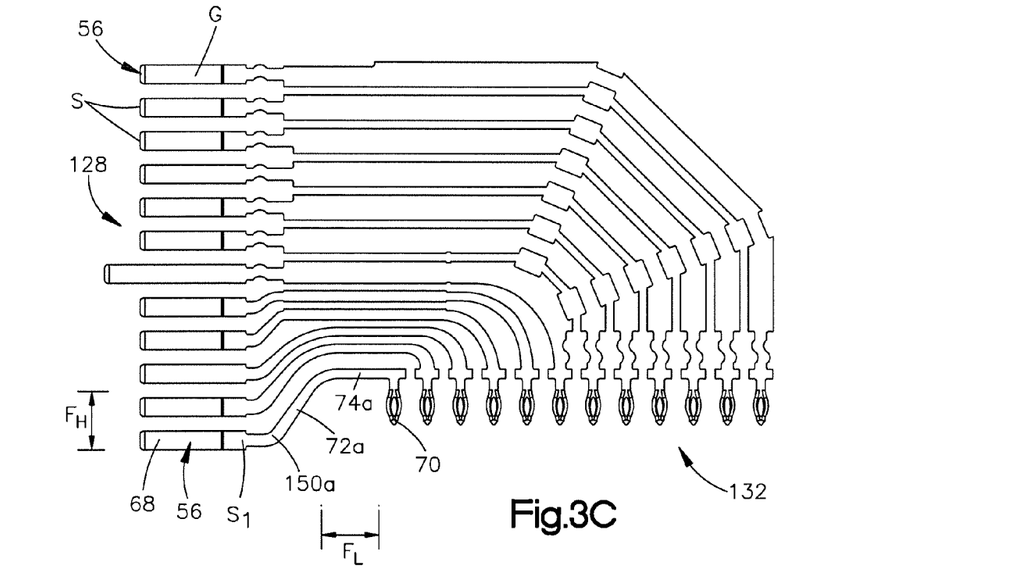
FIG. 3C is a side elevation view of the A-type leadframe assembly shown in FIG. 3B with the leadframe housing removed for clarity.

Referring now to FIGS. 3B and 3C, the leadframe housing 122a of the A-type leadframe assembly 120a defines a transverse top end 123a and an opposed bottom end 124a, a longitudinal front end 125a, and an opposed rear end 126a, and laterally opposed sidewalls 127a. The electrical contacts 56 of the A-type leadframe assembly 120a each define respective mating portions 68 that extend longitudinally forward from the longitudinal front end 125a of the corresponding leadframe housing 122a at a location proximate to the mating interface 128. The mating portions 68 are configured to mate, or electrically connect, with respective mating portions of complementary electrical contacts of the second electrical connector. The electrical contacts 56 further define respective mounting portions 70 that extend down from the bottom end 124a of the corresponding leadframe housing 122a at a location proximate to the mounting interface 132. The mounting portions 70 are configured to electrically connect to electrical traces of the underlying substrate 114. Any suitable dielectric material, such as air or plastic, may be used to isolate the electrical contacts 56 from one another. The mounting portions 70 can include press-fit tails, surface mount tails, or fusible elements such as solder balls.

With continued reference to FIGS. 3B and 3C, the electrical contacts 56 of the A-type and B-type leadframe assemblies 120a and 120b may be either ground contacts G or signal contacts S. The electrical contacts 56 may be arranged in the array in any desired pattern. For example, the contacts may define an arrangement in a repeating S-S-G pattern as illustrated or in a repeating G-S-S pattern along the mating interface 128 between the top and the bottom ends of the lead frame housings 122a and 122b. As shown in FIG. 3B, the A-type leadframe assemblies 120a define an electrical contact arrangement that includes a first or lowermost signal contact $S_1$ that is positioned at the bottom of the contact array proximate to the substrate 114 when the electrical connector 10 is mounted onto the substrate 114. As shown in FIG. 3C, the first signal contact $S_1$ further defines a first transition portion 72a connected to the mating portion 68, and a second transition portion 74a connected to the first transition portion 72a and the mounting portion 70. The first transition portion 72a may have a transverse height $F_H$ that allows a portion 150a of the signal contact $S_1$ to overhang the substrate 114 when the electrical connector 10 is mounted onto the substrate 114. Similarly, the second transition portion 74a has a longitudinal length $F_L$ that extends longitudinally above and along the substrate 114 when the electrical connector 10 is mounted onto the substrate 114.

Figure 4:
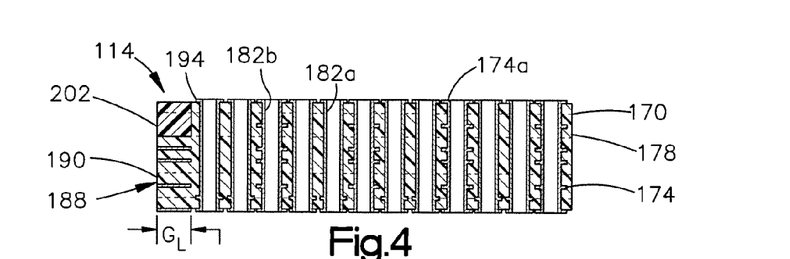
FIG. 4 is a side sectional view of the printed circuit board shown in FIG. 2.
Figure 5A:
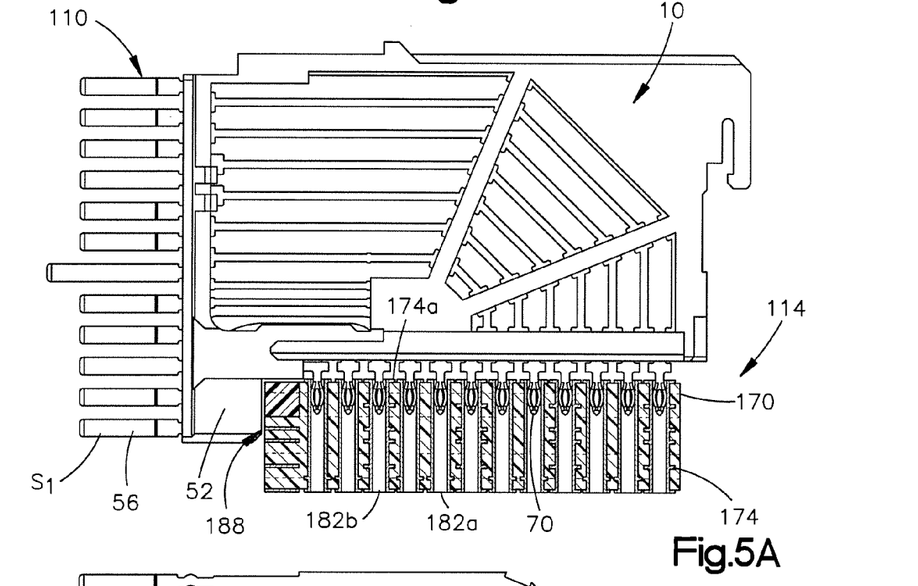
FIG. 5A is a side elevation view of the A-type leadframe assembly shown in FIG. 3B mounted on the printed circuit board shown in FIG. 4.
Figure 5B:
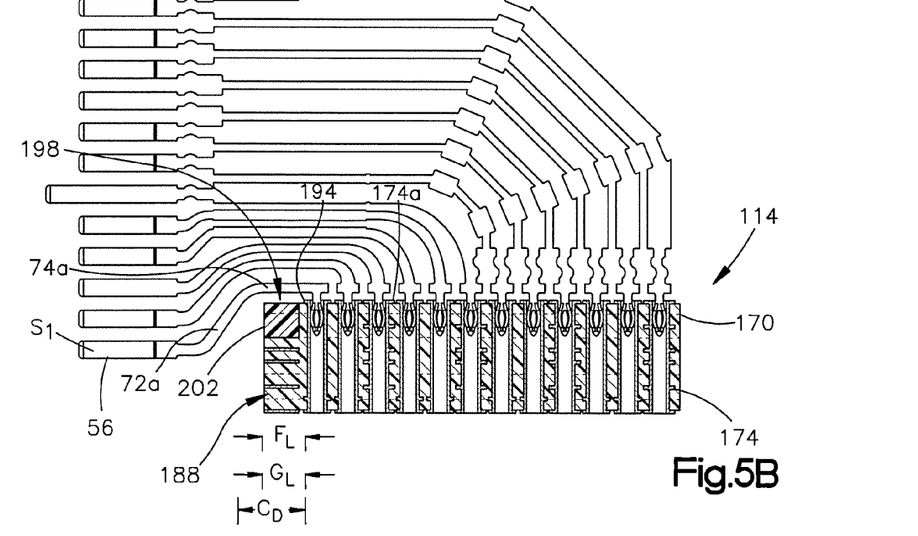
FIG. 5B is a side elevation view of the A-type leadframe assembly shown in FIG. 5A with the leadframe housing removed for clarity.

As shown in FIGS. 4, 5A, and 5B, the substrate 114 includes at least one such as a plurality of trace layers 170, at least one such as a plurality of ground layers 174, and at least one such as a plurality of dielectric layers 178 that are disposed between the trace layers 170 and the ground layers 174 and electrically isolates the trace layers 170 from the ground layers 174. The trace layers 170 include a plurality of conductive traces made of a conductive material such as copper, and the ground layers 174 may also include a conductive material such as copper. The substrate 114 further includes a plurality of signal vias 182a that define an open end and extend transversely into the trace layer 170, and a plurality of ground vias 182b that define an open end and extend transversely into the ground layer 174. The open ends of the signal vias 182a are configured to receive the mounting portions 70 of the signal contacts S so as to electrically connect the signal contacts S to respective traces of the trace layers 170. The open ends of the ground vias 182b are configured to receive the mounting portions 70 of the ground contacts G so as to electrically connect the ground contacts G to the ground layers 174. It should be understood that while the illustrated embodiment includes four trace layers 170 and six ground layers 174, the substrate 114 may include any number of trace layers 170 and ground layers 174 as desired.

As shown in FIGS. 4, 5A, and 5B, the substrate 114 defines a substrate edge 188 that at least partially defines a longitudinally outer boundary of the substrate 114. As shown, each trace layer 170 defines a trace layer edge 190 that extends to and partially defines the substrate edge 188. The ground layers 174 are positioned between the trace layers 170 and each define a ground layer edge 194. As shown in FIG. 4, at least a first or the upper most ground layer 174a defines a ground layer edge 194 that is longitudinally spaced apart from the trace layer edge 190 and thus the substrate edge 188. In that regard, a portion of the ground layer 174a is removed such that the ground layer edge 194 is longitudinally offset from the trace layer edge 190 along the longitudinally rearward direction D2 (see FIG. 2), e.g., away from the mating portions 68, so as to define a gap 198 disposed between the substrate edge 188 and the ground layer edge 194. Thus, a transverse line extending along the trace layer edge 190 is disposed longitudinally forward with respect to the ground layer edge 194 along the insertion direction D1 (see FIG. 2). The gap 198 may have a longitudinal length $G_L$ that is between about 1 mm and about 3 mm, such as about 1.6 mm, though it should be understood that the gap 198 may have any length $G_L$ as desired.

The gap 198 created by the selected removal of the ground layer 174a may be filled with a dielectric material 202, such as FR4, plastic, air, etc. The dielectric material 202 may be attached to the ground layer 174a as illustrated, or may be attached to the connector housing 60, the leadframe assembly 120a, or even to the dielectric layer 178 that separates the ground layer 174a from the trace layer 170. Thus, the dielectric material 202 can define a longitudinal outer boundary 203 that is longitudinally aligned with the trace layer edge 190, and can further define the substrate edge 188.

As shown in FIGS. 5A and 5B, the electrical connector 10 may be mounted onto the substrate 114 such that the mounting portions 70 of the signal contacts S and ground contacts G are press-fit into the signal vias 182a and ground vias 182b, respectively, so as to be placed in electrical communication with the traces running through or along the trace layers 170 of the substrate 114 and the ground layers 174, respectively. When mounted, the overhang portion 52 of the electrical connector 10 overhangs the substrate edge 188 such that the second transition portion 74a of the first signal contact $S_1$ at least partially longitudinally crosses the ground layer edge 194. Furthermore, the first transition portion 72a extends at least partially in the transverse direction T and may intersect a horizontal plane (for instance defined by the longitudinal direction L and the lateral direction A) defined by an upper surface of the ground layer 174a.

Because of the gap 198 in the substrate 114, the first transition portion 72a is separated from the ground layer edge 194 by a distance CD. The distance CD is at least equal to or greater than the length $G_L$ of the gap 198. Therefore the distance CD may be at least 1.1 mm, when the length $G_L$ of the gap 198 is about 1 mm. Moreover, the longitudinal length $F_L$ of the second transition portion 74a can be substantially equal to the longitudinal length $G_L$ of the gap 198. Therefore, at least a substantial portion of the second transition portion 74a may extend over the dielectric material 202 that is disposed in the gap 198 and not the ground layer 174a, and thus overlaps the gap 198 a greater amount compared to when the electrical connector 10 is mounted onto an otherwise identical substrate except that the otherwise identical substrate is not adjusted as described with respect to the electrical connector assembly 110. In this way, it can be said that the substrate 114 is adjusted such that a gap 198 is defined between the ground layer edge 194 and the first transition portion 72a of the first signal contact $S_1$ when the right angle connector is mounted on the substrate 114, and that the first signal contact $S_1$ is electrically isolated from the ground layer 174a. Such an adjustment may for example decrease the connector insertion loss, decrease the connector insertion loss resonance at certain frequencies, and/or decrease the connector crosstalk by about 10 dB in the 5-10 GHz frequency range with respect to the conventional electrical connector assembly 8 illustrated in FIGS. 1A-B—all without substantially affecting impedance of the electrical connector 10.

Figure 6:
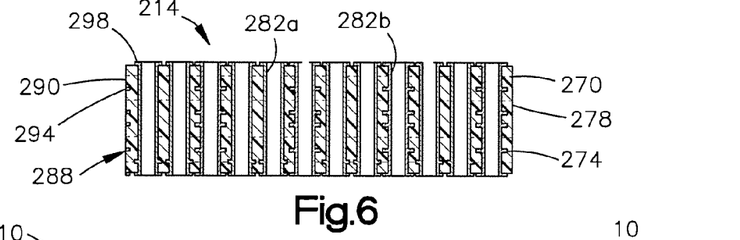
FIG. 6 is a side sectional view of a printed circuit board according to another embodiment.
Figure 7A:
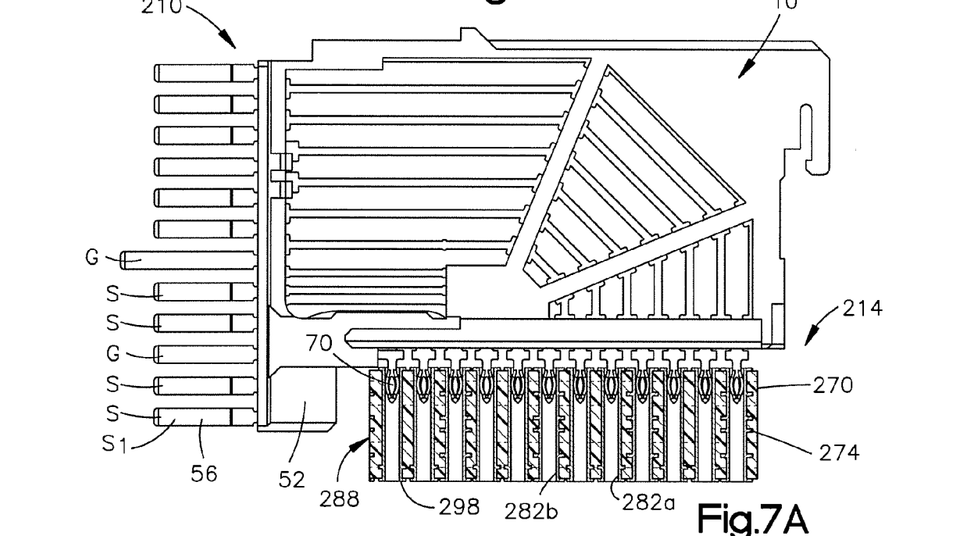
FIG. 7A is a side elevation view of the A-type leadframe assembly shown in FIG. 3B mounted on the printed circuit board shown in FIG. 6.
Figure 7B:
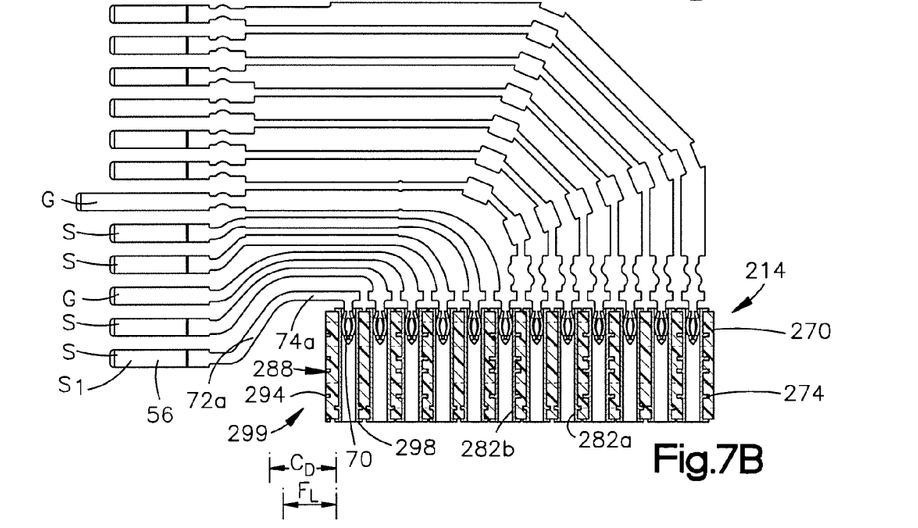
FIG. 7B is a side elevation view of the A-type leadframe assembly shown in FIG. 7A with the leadframe housing removed for clarity.

In another embodiment and in reference to FIGS. 6, 7A, and 7B, an electrical connector assembly 210 is configured to increase the connector overhang with respect to a substrate edge 288 of a substrate 214 relative to the otherwise substantially identical conventional electrical connector assembly 8. For example, as shown in FIG. 6, the substrate 214 includes at least one such as a plurality of trace layers 270, at least one such as a plurality of ground layers 274, and at least one such as a plurality of dielectric layers 278 that are disposed between the trace layers 270 and the ground layers 274 and electrically isolates the trace layers 270 from the ground layers 274. The trace layers 270 each include a plurality of conductive traces made of a conductive material such as copper, and the ground layers 274 may also include a conductive material such as copper. The substrate 214 further includes a plurality of signal vias 282a that each defines an open end and extends transversely into one of the trace layers 270, and a plurality of ground vias 282b that each defines an open end and extends transversely into one of the ground layers 274. The vias 282a-b are configured to receive the mounting portions 70 of the signal contacts S and ground contacts G, respectively, in the manner described above with respect to the signal and ground vias 182a-b. It should be understood that while the illustrated embodiment includes four trace layers 270 and six ground layers 274, the substrate 214 may include any number of trace layers 270 and ground layers 274 as desired.

As shown in FIG. 6, the adjusted substrate 214 defines a substrate edge 288 that at least partially defines an outer boundary of the substrate 214. As shown, each trace layer 270 defines a trace layer edge 290 that extends to and partially defines the substrate edge 288. Similarly, at least one (i.e. the upper most ground layer), such as each ground layer 274 defines a first ground layer edge 294 that extends to and partially defines the substrate edge 288. As shown, the substrate 214 can be adjusted such that a first via 298, which for A-type leadframe assemblies 120a is a signal via 282a is positioned adjacent to and proximate to the substrate edge 288. For instance, the center of the first via 298 can be spaced from the substrate edge 288 a distance less than about 2.35 mm and greater than about 0.7 mm. The first via 298 is configured to receive the mounting portion 70 of the first signal contact $S_1$. Therefore, when the electrical connector 10 is mounted on the substrate 214, the overhang of the electrical connector 10 is increased relative to the substrate 214 with respect to the conventional electrical connector assembly 8 illustrated in FIGS. 1A-B.

As shown in FIG. 7A, the electrical connector 10 may be mounted onto the substrate 214 such that the mounting portions 70 of the signal contacts S are press-fit into the open ends of the signal vias 282a so as to be placed in electrical communication with the traces running through or along the trace layers 270 of the substrate 214, and the mounting portions 70 of the ground contacts G are press-fit into the open ends of the ground vias 282b so as to be placed in electrical communication with the ground layers 274. When the electrical connector 10 is mounted to the substrate 214, the electrical connector 10 overhangs the substrate edge 288 such that the second transition portion 74a of the first signal contact $S_1$ at least partially longitudinally crosses the first ground layer edge 294. Furthermore, the first transition portion 72a extends at least partially in the transverse direction T and may intersect a horizontal plane (for instance defined by the longitudinal direction L and the lateral direction A) defined by an upper surface of the ground layer 274.

Because of the location of the first via 298 in the substrate 214, the first transition portion 72a is separated from the first ground layer edge 294 by a distance CD to thereby create a gap 299 between the first transition portion 72a and the first ground layer edge 294. The distance CD may be between about 0.1 mm and about 1.75 mm. Moreover, the second transition portion 74a has a longitudinal length $F_L$ that allows a substantial portion of the second transition portion 74a to only extend over the gap 299 and not the ground layers 274 a greater distance compared to when the electrical connector 10 is mounted onto an otherwise identical substrate except that the otherwise identical substrate is not adjusted as described with respect to FIGS. 7A-B. For instance, a longitudinal length of between 0 mm and about 1.75 mm overlaps the ground layers 274. In this way, it can be said that the substrate is adjusted such that a gap 299 is defined between the first ground layer edge 294 and the first transition portion 72a when the connector is mounted onto the substrate 214, and that the first signal contact $S_1$ is electrically isolated from the ground layer 274. Such an adjustment may for example decrease the connector insertion loss, decrease the connector insertion loss resonance at certain frequencies, and/or decrease the connector crosstalk by about 10 dB in the 5-10 GHz frequency range with respect to the conventional electrical connector assembly 8 as described above with respect to FIGS. 1A-B—all without substantially affecting impedance of the electrical connector 10.

As shown in FIGS. 8A, 8b, 9A, 9B, 10A, and 10B, crosstalk may also be reduced in the B-type leadframe assemblies 120b when the connector 10 is mounted on the substrates 114, and 214. Therefore, crosstalk may be reduced in each leadframe assembly 120a and 120b when the electrical connector 10 is mounted on either the substrate 114 or the substrate 214 as compared to when the connector 10 is mounted on a substrate 14 as shown in FIGS. 1A and 1B.

Figure 8A:
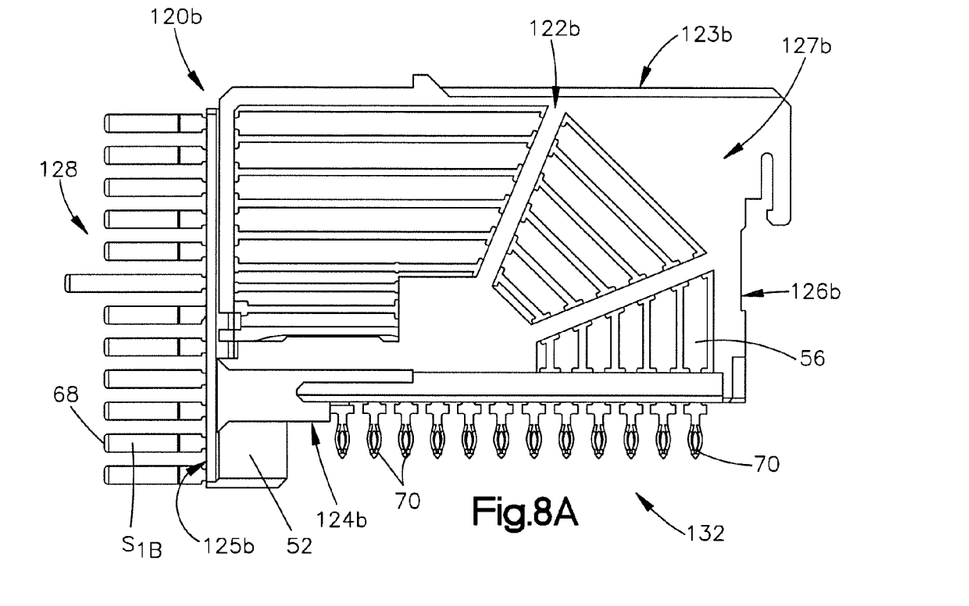
FIG. 8A is a side elevation view of one of the B-type leadframe assemblies shown in FIG. 3A, the B-type leadframe assembly including a leadframe housing, and a plurality of electrical contacts carried by the leadframe housing.
Figure 8B:
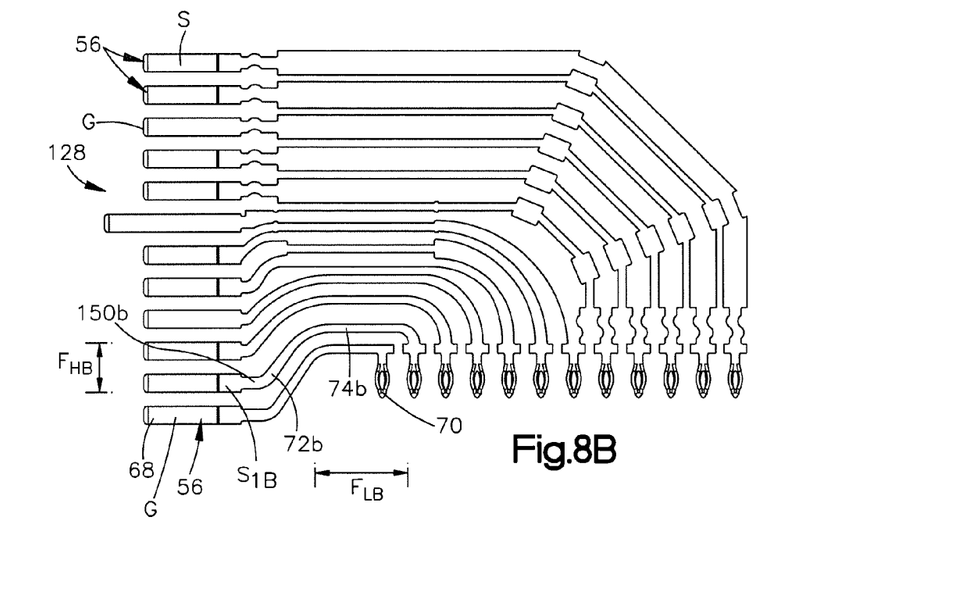
FIG. 8B is a side elevation view of the B-type leadframe assembly shown in FIG. 8A with the leadframe housing removed for clarity.

Now referring to FIGS. 8A and 8B, the leadframe housing 122b of the B-type leadframe assembly 120b defines a transverse top end 123b and an opposed bottom end 124b, a longitudinal front end 125b, and an opposed rear end 126b, and laterally opposed sidewalls 127b. The electrical contacts 56 of the B-type leadframe assembly 120b each define respective mating portions 68 that extend longitudinally forward from the longitudinal front end 125b of the corresponding leadframe housing 122b at a location proximate to the mating interface 128. The mating portions 68 are configured to mate, or electrically connect, with respective mating portions of complementary electrical contacts of the second electrical connector. The electrical contacts 56 further define respective mounting portions 70 that extend down from the bottom end 124b of the corresponding leadframe housing 122b at a location proximate to the mounting interface 132. The mounting portions 70 are configured to electrically connect to electrical traces of the underlying substrates 114 or 214. Any suitable dielectric material, such as air or plastic, may be used to isolate the electrical contacts 56 from one another. The mounting portions 70 can include press-fit tails, surface mount tails, or fusible elements such as solder balls.

With continued reference to FIGS. 8A and 8B, the B-type leadframe assemblies 120b each define an electrical contact arrangement that includes a first or lowermost signal contact $S_{1_B}$ that is positioned adjacent to the bottom most contact of the contact array that is proximate to the substrate 114 when the electrical connector 10 is mounted onto the substrate 114. As shown in FIG. 8B, the first signal contact $S_{1_B}$ further defines a first transition portion 72b connected to the mating portion 68, and a second transition portion 74b connected to the first transition portion 72b and the mounting portion 70. The first transition portion 72b may have a transverse height $F_{HB}$ that allows a portion 150b of the signal contact $S_{1_B}$ to overhang the substrate 114 when the electrical connector 10 is mounted onto the substrate 114. Similarly, the second transition portion 74b has a longitudinal length $F_{LB}$ that extends longitudinally above and along the substrate 114 when the electrical connector 10 is mounted onto the substrate 114.

Figure 9A:
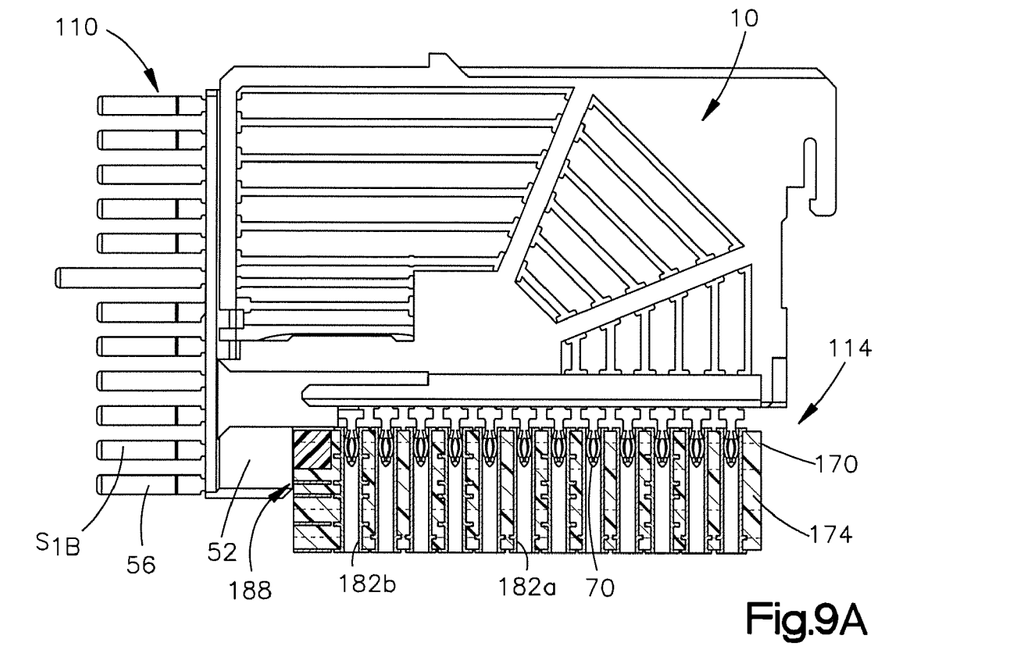
FIG. 9A is a side elevation view of the B-type leadframe assembly shown in FIG. 8A mounted on the printed circuit board shown in FIG. 4.
Figure 9B:
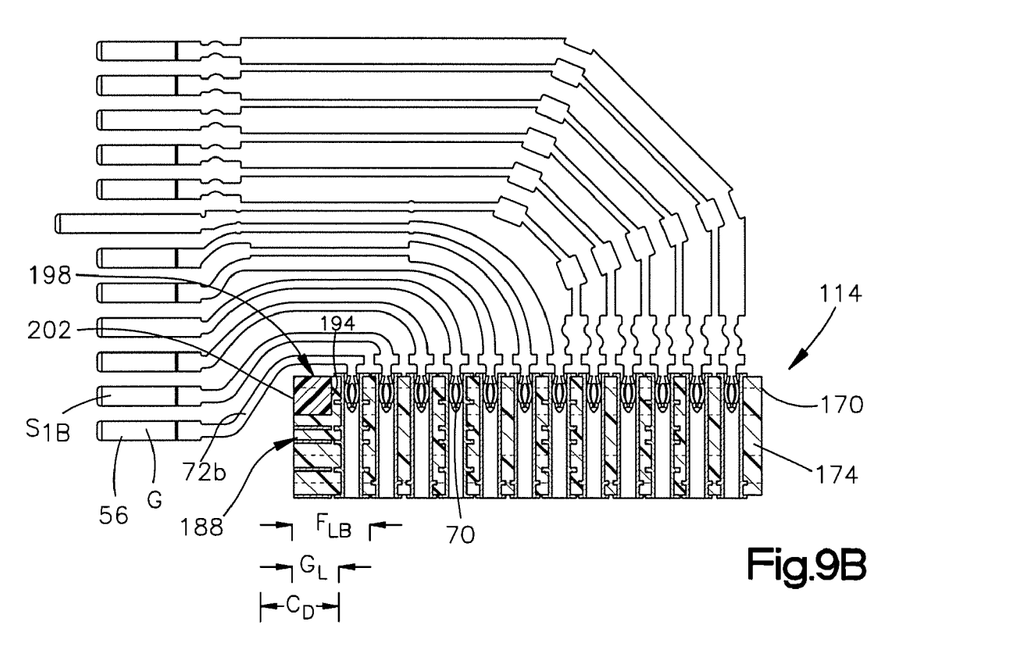
FIG. 9B is a side elevation view of the B-type leadframe assembly shown in FIG. 9A with the leadframe housing removed for clarity.

As shown in FIGS. 9A and 9B, the electrical connector 10, and thus the B-type leadframe assembly 120b may be mounted onto the substrate 114 such that the mounting portions 70 of the signal contacts S and ground contacts G are press-fit into the signal vias 182a and ground vias 182b, respectively, so as to be placed in electrical communication with the traces running through or along the trace layers 170 of the substrate 114 and the ground layers 174, respectively. When mounted, the overhang portion 52 of the electrical connector 10 overhangs the substrate edge 188 such that the second transition portion 74b of the first signal contact $S_{1_B}$ at least partially longitudinally crosses the ground layer edge 194. Furthermore, the first transition portion 72b extends at least partially in the transverse direction T and may intersect a horizontal plane (for instance defined by the longitudinal direction L and the lateral direction A) defined by an upper surface of the ground layer 174a.

Because of the gap 198 in the substrate 114, the first transition portion 72b is separated from the ground layer edge 194 by a distance CD. The distance CD is at least equal to or greater than the length $G_L$ of the gap 198. Therefore the distance CD may be at least about 1.1 mm for a gap 198 having a length $G_L$ of about 1 mm. Moreover, at least a substantial portion of the second transition portion 74b may extend over the dielectric material 202 that is disposed in the gap 198 and not the ground layer 174a, and thus overlaps the gap 198 a greater amount compared to when the electrical connector 10 is mounted onto an otherwise identical substrate except that the otherwise identical substrate is not adjusted as described with respect to the electrical connector assembly 110. In this way, it can be said that the substrate 114 is adjusted such that a gap 198 is defined between the ground layer edge 194 and the first transition portion 72b of the first signal contact $S_{1_B}$ when the right angle connector is mounted on the substrate 114, and that the first signal contact $S_{1_B}$ is electrically isolated from the ground layer 174a. As with the A-type leadframe assembly 120a, such an adjustment may for example decrease the connector insertion loss, decrease the connector insertion loss resonance at certain frequencies, and/or decrease the connector crosstalk with respect to the conventional electrical connector assembly 8 illustrated in FIGS. 1A-B—all without substantially affecting impedance of the electrical connector 10.

Figure 10A:
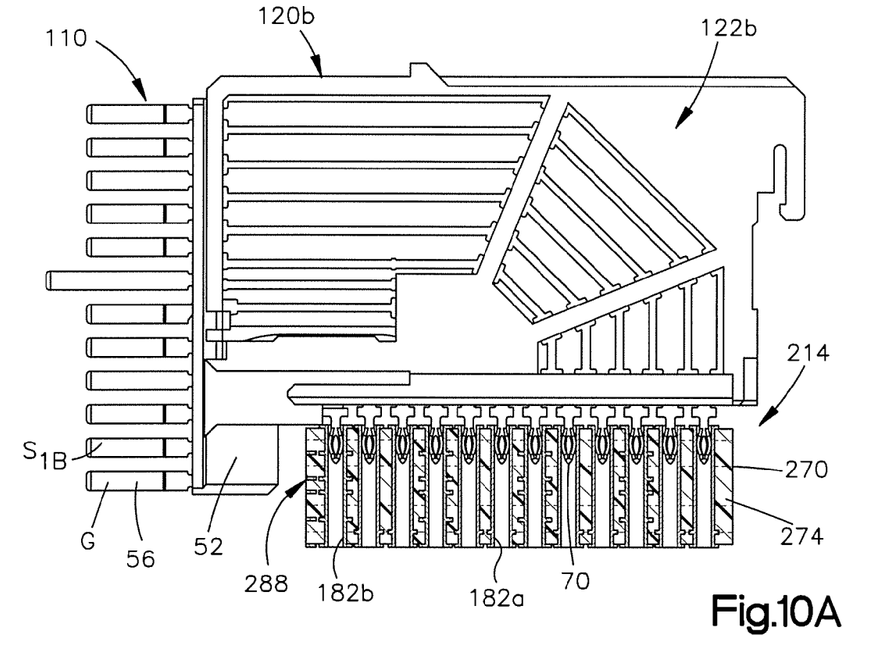
FIG. 10A is a side elevation view of the B-type leadframe assembly shown in FIG. 8A mounted on the printed circuit board shown in FIG. 6.
Figure 10B:
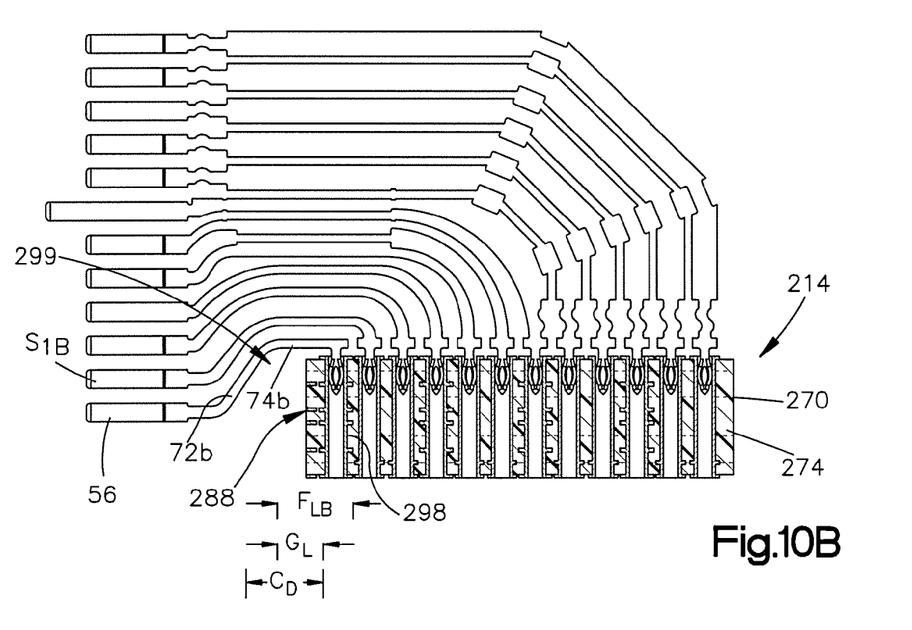
FIG. 10B is a side elevation view of the B-type leadframe assembly shown in FIG. 10A with the leadframe housing removed for clarity.

As shown in FIGS. 10A and 10B, when the electrical connector 10, and thus the B-type leadframe assembly 120b, is mounted onto the substrate 214, shown in FIG. 6, the mounting portions 70 of the signal contacts S are press-fit into the open ends of the signal vias 282a so as to be placed in electrical communication with the traces running through or along the trace layers 270 of the substrate 214, and the mounting portions 70 of the ground contacts G are press-fit into the open ends of the ground vias 282b so as to be placed in electrical communication with the ground layers 274. As shown, when the electrical connector 10 is mounted to the substrate 214, the electrical connector 10 overhangs the substrate edge 288 such that the second transition portion 74b of the first signal contact $S_{1_B}$ at least partially longitudinally crosses the first ground layer edge 294. Furthermore, the first transition portion 72b extends at least partially in the transverse direction T and may intersect a horizontal plane (for instance defined by the longitudinal direction L and the lateral direction A) defined by an upper surface of the ground layer 274.

Because of the location of the first via 298 in the substrate 214, the first transition portion 72b is separated from the first ground layer edge 294 by a distance CD to thereby create a gap 299 between the first transition portion 72a and the first ground layer edge 294. The distance CD may be between about 0.1 mm and about 1.75 mm. Moreover, the second transition portion 74b has a longitudinal length $F_{LB}$ that allows a substantial portion of the second transition portion 74b to only extend over the gap 299 and not the ground layers 274 a greater distance compared to when the electrical connector 10 is mounted onto an otherwise identical substrate except that the otherwise identical substrate is not adjusted as described with respect to FIGS. 10A-B. For instance, a longitudinal length of between about 0 mm and about 1.75 mm overlaps the ground layers 274. In this way, it can be said that the substrate is adjusted such that a gap 299 is defined between the first ground layer edge 294 and the first transition portion 72b when the connector is mounted onto the substrate 214, and that the first signal contact $S_{1_B}$ is electrically isolated from the ground layer 274. Such an adjustment may for example decrease the connector insertion loss, decrease the connector insertion loss resonance at certain frequencies, and/or decrease the connector crosstalk with respect to the conventional electrical connector assembly 8 as described above with respect to FIGS. 1A-B—all without substantially affecting impedance of the electrical connector 10. It should be appreciated that the conventional electrical connector assembly 8 can be constructed substantially identically (taking into account manufacturing tolerances and the like) with respect to the electrical connector assemblies 110 and 210 with the exception of the adjustment of the respective substrates 114 and 214.

The embodiments described in connection with the illustrated embodiments have been presented by way of illustration, and the present invention is therefore not intended to be limited to the disclosed embodiments. Furthermore, the structure and features of each the embodiments described above can be applied to the other embodiments described herein, unless otherwise indicated, for example the distance CD between the first transition portions 72a or 72b, and the ground layer edge can be constructed using any combination of substrates 114 and 214. That is, a portion of the first ground layer may be removed and the first via may be moved closer to the substrate edge.

Another embodiment includes a method to reduce crosstalk in an electrical connector assembly. The method may comprise the step of disclosing or teaching to a third party, by an act of providing audible words or a visual depiction fixed in a tangible medium of expression to the third party, the use of a substrate having a ground layer and a trace layer separated by a dielectric material, the substrate defining a substrate edge, and the ground layer defining a first ground edge as described with respect to the substrates shown in FIGS. 4 and 6. For instance, as used herein, the step of disclosing or teaching can be direct or with the aid of a machine or a device. Also as used herein, the visual depiction fixed in a tangible medium of expression can be sufficiently permanent or stable to permit it to be perceived, reproduced, or otherwise communicated. Another step may include a step of providing a right angle connector having a signal contact that defines a mating portion, a mounting portion, a first transition portion connected to the mating portion, and a second transition portion connected to the first transition portion and the mounting portion. The right angle connector may be configured to be attached to the substrate such that the right angle connector overhangs the substrate edge of the substrate, and the first transition portion of the signal contact at least partially crosses the first ground edge. Another step may include a step of disclosing or teaching to the third party, by audible words or a visual depiction fixed in a tangible medium of expression, adjustment of the substrate such that a gap is defined between the first ground edge and the first transition portion, and substantial portion of the second transition portion extends over the gap when the right angle connector is mounted on the substrate.

What is claimed is:

1. A method to improve signal transmission in an electrical connector assembly, the method comprising the steps of:
   providing or teaching use of a substrate having an electrically conductive ground layer and at least one electrically conductive trace separated from the electrically conductive ground layer by a dielectric material along a first direction, the substrate defining a substrate edge, and the electrically conductive ground layer defining a ground edge;
   providing an electrical connector having a signal contact that defines a mating portion, a mounting portion, a first transition portion connected to the mating portion, and a second transition portion connected between the first transition portion and the mounting portion, the second transition portion extending more along a second direction that is perpendicular to the first direction than along the first direction, the electrical connector configured to be attached to the substrate such that a portion of the electrical connector overhangs the substrate edge of the substrate;
   adjusting or teaching adjustment of the substrate along the second direction such that when the electrical connector is mounted on the substrate (i) at least a portion of the first transition portion is aligned with, and spaced from the ground edge along the second direction so as to define a gap is between the ground edge and the at least a portion of the first transition portion along the second direction and (ii) a majority of the second transition portion extends over the gap along the second direction, wherein the gap is devoid of the electrically conductive ground layer.

2. The method according to claim 1, wherein the adjusting step comprises removing a portion of the electrically conductive ground layer, such that the gap is at least partially defined between the ground edge and the substrate edge of the substrate along the second direction.

3. The method according to claim 2, further comprising filling the gap with a dielectric material.

4. The method according to claim 3, wherein the filling step comprises attaching the dielectric material to the ground layer of the substrate.

5. The method according to claim 3, wherein the gap is between about 1 and about 3 mm in length.

6. The method according to claim 1, wherein the adjusting step comprises positioning a first via in the substrate proximate to the substrate edge, the first via configured to receive the mounting portion of the signal contact.

7. The method according to claim 1, wherein the ground edge is separated from the first transition portion of the signal contact by a distance between about 0.1 mm and about 1.75 mm when the electrical connector is mounted on the substrate.

8. The method according to claim 1, wherein the providing or teaching step further comprises the step of providing or teaching the substrate edge defined by the dielectric material.

9. The method according to claim 1, wherein the providing or teaching step further comprises the step of providing or teaching the first transition portion disposed between the mating portion and the second transition portion.

10. A substrate configured to have an electrical connector mounted thereon such that a portion of the electrical connector overhangs the substrate, the substrate comprising:
    at least one electrically conductive trace;
    a ground layer including an electrically conductive ground material, the ground layer spaced from the at least one electrically conductive trace along a first direction, the ground layer defining a ground layer edge that extends along the first direction; and
    a dielectric layer disposed between the trace layer and the ground layer along the first direction, wherein the dielectric layer at least partially defines a substrate edge that extends along the first direction,
    wherein the ground layer edge is recessed with respect to the substrate edge along a second direction that is perpendicular to the first direction by so as to define a gap that extends along the second direction from the ground layer edge to a line that extends from the substrate edge along the first direction, and the gap is devoid of the electrically conductive ground material.

11. The substrate according to claim 10, wherein the gap defines a distance that is between about 1 mm and about 3 mm.

12. The substrate according to claim 11, wherein the gap defines a distance of about 1.6 mm.

13. The substrate according to claim 10, wherein the gap is filled with a dielectric material.

14. The substrate according to claim 13, wherein the dielectric material is FR4 or plastic.

15. The substrate according to claim 10, wherein the ground layer and the at least one trace are each disposed immediately adjacent the dielectric layer.

16. An electrical connector assembly comprising:
a substrate including a ground layer including an electrically conductive ground material, an electrically conductive trace material, and a dielectric material disposed between the ground material and the trace material along a first direction, the ground layer defining a ground edge that extends along the first direction; and
an electrical connector mounted on the substrate such that a portion of the electrical connector overhangs the ground edge, the electrical connector including a first signal contact that defines a mating portion, a mounting portion, a first transition portion connected to the mating portion, and a second transition portion connected to both the first transition portion and the mounting portion, the second transition portion extending more along a second direction that is perpendicular to the first direction than along the first direction, wherein (i) at least a portion of the first transition portion is both aligned with the ground edge along the second direction and spaced from the ground edge along the second direction so as to define a gap that extends from the ground edge and to the at least a portion of the first transition portion along the second direction, when the electrical connector is mounted on the substrate, (ii) a majority of the second transition portion is aligned with the gap along the first direction when the electrical connector is mounted on the substrate, and (iii) the gap is devoid of all of a) the dielectric material, b) the electrically conductive ground material, and c) the electrically conductive trace material.

17. The electrical connector assembly according to claim 16, wherein the ground edge is separated from the first transition portion of the signal contact by a distance between about 0.1 mm and about 1.75 mm when the electrical connector is mounted on the substrate.

18. The electrical connector assembly according to claim 16, wherein the dielectric material is attached to the ground layer of the substrate.

* * * * *

UNITED STATES PATENT AND TRADEMARK OFFICE
CERTIFICATE OF CORRECTION

PATENT NO.        : 8,361,896 B2                                   Page 1 of 1
APPLICATION NO.   : 13/166155
DATED             : January 29, 2013
INVENTOR(S)       : Jan De Geest It is certified that error appears in the above-identified patent and that said Letters Patent is hereby corrected as shown below:

COL. 12 [claim 10] line 58, after "direction" delete "by"

Signed and Sealed this
Twelfth Day of March, 2013

Teresa Stanek Rea
*Acting Director of the United States Patent and Trademark Office*